(12) United States Patent
Favre et al.

(10) Patent No.: US 8,151,816 B2
(45) Date of Patent: Apr. 10, 2012

(54) METHOD AND DEVICE FOR REMOVING POLLUTION FROM A CONFINED ENVIRONMENT

(75) Inventors: Arnaud Favre, Annecy (FR); Bertrand Bellet, Chambery (FR); Roland Bernard, Chiesaz (FR); Xavier Metais, Meythet (FR)

(73) Assignee: Alcatel-Lucent, Paris (FR)

( * ) Notice: Subject to any disclaimer, the term of this patent is extended or adjusted under 35 U.S.C. 154(b) by 595 days.

(21) Appl. No.: 12/227,587

(22) PCT Filed: May 24, 2007

(86) PCT No.: PCT/FR2007/051328
§ 371 (c)(1),
(2), (4) Date: Feb. 5, 2009

(87) PCT Pub. No.: WO2007/135347
PCT Pub. Date: Nov. 29, 2007

(65) Prior Publication Data
US 2009/0263216 A1     Oct. 22, 2009

(30) Foreign Application Priority Data
May 24, 2006    (FR) ...................................... 06 04668

(51) Int. Cl.
*H01L 21/00* (2006.01)

(52) U.S. Cl. ............ 137/15.04; 137/340; 422/1; 422/28
(58) Field of Classification Search .................. 137/240, 137/15.01, 15.04; 422/1, 28, 31, 62
See application file for complete search history.

(56) References Cited

U.S. PATENT DOCUMENTS

| 5,788,448 A | 8/1998 | Wakamori et al. |
| 6,228,330 B1 * | 5/2001 | Herrmann et al. ....... 422/186.05 |
| 6,558,622 B1 * | 5/2003 | Malchesky ....................... 422/28 |
| 6,984,361 B2 * | 1/2006 | Carman et al. .................. 422/33 |

FOREIGN PATENT DOCUMENTS

| EP | 1 059 660 A | 12/2000 |
| JP | 2004 128428 A | 4/2004 |

* cited by examiner

*Primary Examiner* — Kevin Lee
(74) *Attorney, Agent, or Firm* — Carmen Patti Law Group, LLC

(57) ABSTRACT

The subject of the present invention is a method for removing pollution from a confined environment containing an interior space bounded by a wall, involving the following steps: the confined environment which has a leak is placed in a sealed chamber having for example an inlet for introducing a gas and a pump for pumping a gas and the gas contained in the chamber and the gas contained inside the space are simultaneously pumped through the leak so that the pressure difference across the wall is always below a wall damaging threshold. Another subject of the invention is a related device for removing pollution from a confined environment.

30 Claims, 9 Drawing Sheets

METHOD AND DEVICE FOR REMOVING POLLUTION FROM A CONFINED ENVIRONMENT

TECHNICAL FIELD OF THE INVENTION

The invention pertains to the cleaning and depollution of unsealed confined environments, particularly including storage and transport pods for semiconductor substrates, agrifood products, medical or automobile products, or photomasks equipped with their protective films.

Storage and transport pods under atmospheric pressure for one or more substrates, particularly for semiconductor wafers, define an enclosed space, separated from the environment in which the substrates are used and transported by a peripheral wall equipped with an opening through which subtrates may pass, covered by a door. This type of transport pod is most commonly made of plastic and is not generally sealed when in service. The plastic peripheral wall is not designed to withstand pressures greater than a few tens of atmospheres without sustaining damage. The transport pods are therefore designed with at least one leak, so that when a difference in pressure exists between the interior and exterior of the box, a gas flow occurs to minimize the difference in pressure and thereby reduce the mechanical stress on the peripheral wall. For FOUP transport pods, a particle filter is placed inside the leak to reduce pollution. Normally, the atmosphere within the pod is uncontrolled, and it is assumed that it is most commonly similar to that of the equipment from which the substrates have exited, or the ambient air near the transport pod.

The transport pods are generally effective at preventing polluting particles from penetrating into the confined space. Their usage is made necessary by the increasing need to reduce particle pollution, particularly when manufacturing semiconductors and other nanotechnology products. However, the plastic peripheral walls of the transports pods may leak gas, or may maintain or add compounds that may react with the substrates and pollute them. These compounds may, in particular, come from an inadequate environment (such as one in which humidity is present) during certain phases in the manufacturing of the substrates. This environment is then maintained by the internal atmosphere of the transport pods. Thus, the transport pods are insufficient at preventing all danger of pollution, and furthermore may in certain cases even contribute to additional pollution (gas leaking through the walls, retaining humidity, cross-contamination, opening/closing mechanisms that generate particles, lack of air-tightness in the walls, etc.)

The document EP 1,557,878 describes the purging of a stack of substrate wafers placed inside a sealed mini-environment chamber, equipped with an access hole that may be covered with a lower door, and filled with air, for example. The chamber is connected by its lower surface to a purging station comprising a purging compartment equipped with an upper transfer hole that may be closed, facing the lower surface of the chamber, by opening the lower door; a stack of substrate wafers supported by the lower door is inserted into the purging compartment, which had been filled with nitrogen beforehand. At the same time that the spaces between the substrate wafers are purged, the interior of the mini-environment chamber is purged through penetration, and gas is expelled through the closable access hole, which at this point is open. An analysis of the interior atmosphere of the chamber is performed in order to test its quality.

The described method pertains to the cleaning of the substrate wafers, which in order to do so must be removed from the chamber: the purging of the chamber is not the main objective. This method does not guarantee that the chamber is cleaned more thoroughly. This method only applies to a sealed chamber, and may not be used for an unsealed confined environment. Furthermore, it involves the functioning of mechanisms for opening and closing the access holes, and for transport.

The document EP 0626724 discloses a method for dry-cleaning the external walls of a transport pod, containing semiconductor substrates in a sealed, clean atmosphere (a vacuum or inert gas), before being inserted into an installation. The sealed pod containing the substrates is placed into a tunnel. Multiple methods for cleaning the outer walls using gases may be used, such as alternately introducing a gas flow ($N_2$) and creating a vacuum. When the cleaning is finished, a vacuum is formed within the tunnel equivalent to that which exists in the installation into which the transport pod will be inserted.

The cleanliness of the pod's internal atmosphere is therefore implicitly assumed in this document. This method makes no suggestions regarding how to clean the interior volume, the walls of the pod, or the substrates that it contains. Furthermore, this cleaning method applies to a sealed pod intended to keep the substrate wafers in a vacuum. Its walls therefore have a high mechanical resistance, which is not the case for non-sealed transport pods intended to transport substrate wafers at atmospheric pressure.

The document JP 2004 128428 A describes a method and device for replacing the gas of a confined environment, such as a transport pod, with an inert gas, while reducing the quantity of inert gas needed for this replacement. To do so, the document gives instructions to place the transport pod in a vacuum chamber, open the transport pod by removing a plug by means of an opening and closing mechanism provided within the vacuum chamber, and then pump the gases into the vacuum chamber and within the transport pod, and finally introducing the inert gas into the vacuum chamber and into the transport pod. The opening of the transport pod inside the vacuum chamber makes it possible to pump the gases into the vacuum chamber without creating a difference in pressure between the exterior and interior of the transport pod.

The document EP 1059660 A2 describes the replacement of the oxygenated atmosphere of an enclosed environment with nitrogen, in order to avoid oxidation. This replacement is done by injecting nitrogen directly into the enclosed environment, with the nitrogen gradually replacing the initial oxygenated gas. The atmosphere inside the enclosed environment is not pumped.

In all of the documents mentioned above, the functioning involves opening the transport pod by operating opening and closing mechanisms, and this operation may generate particle pollution. The particles produced in this manner may accumulate onto the substrate wafers contained within the transport pod, which is incompatible with the increasing requirements to reduce particle pollution when manufacturing semiconductors and other nanotechnology products.

Furthermore, none of these documents describe or resolve the problem of gas pollution resulting from degassing the plastic walls of the transport pods at atmospheric pressure.

A photomask is equivalent to a photographic negative: its active surface contains information to be printed onto a substrate. It is used in transmission for insolating and printing onto semiconductor substrates. Incident radiation is focused onto the active surface of the photomask, and the patterns contained on the active surface are then reproduced onto the substrate. Outside of the active surface, the details are not printed onto the substrate, but may have an impact on the transmission of the photomask. Pollution in the active area has a direct effect on the image printed onto the substrate, because the defects are printed. However, this pollution only has an indirect effect on this image if it occurs outside of this area, such as reducing the contrast or reducing the transmission of the photomask.

Furthermore, the semiconductor industry is researching how to reduce the dimensions of the printed image in order to obtain electronic components which are increasingly small and less expensive. As the dimensions of the elementary patterns of the photographs are becoming smaller, the requirements regarding pollution are becoming ever stricter. The photomask is therefore a key, expensive, and complex element which should be kept clean and operational.

At the end of manufacturing, the photomask is cleaned and inspected. If it is clean and has no defects, the photomask is covered in film and sent to the client. The purpose of the film is to protect the photomask while it is being used by the user. The film consists of an optical membrane deposit (parallel multilayer surfaces) with a good transmission and a reduced impact on the optical rays which pass through it. This film is deposited on the side of the active surface of the photomask, and separated from it by a space. The pollutants, instead of accumulating onto the active surface of the photomask, thereby accumulate onto the film, i.e. outside of the focus area (physically separated from the active surface). In this matter, the pollutants will not be printed during the lithographic transfer: the film does not directly protect against pollutants, but it makes it possible to reduce their impact on the image.

The film is most commonly pasted onto the edge of the active part of the mask. The atmosphere within the film is thereby isolated from the atmosphere of the photomask's transport pod. To keep the film from warping, orifices with low-conductance filters are provided on the sides of the film. These orifices ensure a balance in the pressure between the enclosed atmosphere within the film and the atmosphere inside the transport pod.

It has recently been noticed that pollutants may still be present under the film. Crystal growths, which develop on the active surface of the photomask, within the focus area, may be observed underneath the film. These growths, amplified with the reduction in size of the technology, have a direct effect on the lithography steps (defects are printed). Their location underneath the film makes cleaning difficult. Cleaning a photomask already equipped with its film is a long, complex, and expensive process, because to date it has been necessary to remove the film for cleaning, then reapply it. This delicate operation must be performed by the manufacturers of the photomasks, and not by the users, which wastes time and results in significant additional management costs for the stock due to the short lifespan of the photomasks.

The document WO 851126 proposes to avoid polluting the inner surface of the mask during its manufacturing up to the moment when it is affixed to the photomask. It proposes to dispose a peelable coating on the side of the inner surface of the film. This document does not propose a solution for cleaning a photomask with its film already affixed.

The document JP 10-308337 proposes a method for cleaning the outer surface of the photomask with its film attached in a liquid environment, and does not provide for the removing of the film. This document does not propose a solution for cleaning the enclosed space between the surface of the photomask and the film.

No known method makes it possible to clean the volume separating the substrate from the inner surface of the film without it being necessary to remove this film.

The invention results from the observation that the known methods and devices, in particular those mentioned above, do not make it possible to prevent the appearance of pollution on the active surfaces of the film's photomasks, or on the active surfaces of the semiconductor wafers contained within the transport pods at atmospheric pressure, in a sufficiently effective manner.

According to the invention, it is assumed that this pollution which, within the known methods and devices, continues to appear on the active surfaces of the photomasks or semiconductor wafers, results from both particle pollution generated by the opening and closing of the unsealed enclosed environments formed by the atmospheric transport pods or the film-covered masks, and by gas pollution caused by the gases present within the enclosed environments, which may combine with the matter of the active surfaces or form deposits thereupon.

In particular, for atmospheric transport pods made of plastic, gas pollution particularly results from degassing the plastic material.

This pollution gradually develops over time, and particularly impedes the easy storage and sufficient life span of semiconductor wafers between various steps of manufacturing the components or microelectronic Microsystems, or reduces the life span of the film-covered photomasks.

DISCLOSURE OF INVENTION

The invention thereby aims to considerably reduce the dangers of pollution on the active surfaces found within the unsealed enclosed environments, such as the active surfaces of film-covered photomasks, or the active surfaces of semiconductor wafers contained within atmospheric transport pods.

Another purpose of the invention is to ensure that pollution is effectively removed from the unsealed enclosed environments, in order to increase the period of time before pollution may reappear on the active surfaces of the products.

Another purpose of the invention is to further prolong the non-pollution period, through passivation of the inactive services of the unsealed enclosed environments, preventing these inactive surfaces, such as the walls of the transport pods, from generating, during their practical use, gas pollution that may affect the active surfaces of the products.

The idea at the basis of the invention is to ensure the decontamination of the unsealed enclosed environment, by effectively pumping the inner atmosphere of the unsealed enclosed environment and then restoring atmospheric pressure, but without opening the unsealed enclosed environment, in order to prevent any opening and closing mechanism operation that may generate particle pollution. To do so, the invention provides that the gases enter and leave the unsealed environment through the lone natural leak in the unsealed environment. However, in this situation, other means must be provided to prevent the deterioration of the walls of the unsealed enclosed environment. This is because these walls are unable to withstand significant differences in pressure without degrading: for a photomask, the film cannot withstand a difference in pressure greater than about 1 Pa; for currently used atmospheric transport pods, the plastic walls cannot withstand a differential pressure greater than a few tens of atmospheres.

To achieve this, the invention discloses a method for removing pollution from an unsealed enclosed environment comprising an inner space delimited by a wall having a natural leak, said method comprising the following steps:

the unsealed enclosed environment, having its natural leak, is placed within a sealed decontamination chamber comprising means for introducing gas and means for pumping out gas, the gas contained within the decontamination chamber is pumped out by adjusting the pressure drop within the decontamination chamber in such a way so that the difference in pressure between the interior and exterior of the unsealed enclosed environment is at all times less than the difference in pressure that would cause mechanical warping that would damage the wall of the unsealed enclosed environment.

In such a method, the unsealed environment remains enclosed, i.e. confined, without operating its opening means, and gases pass into and out of the enclosed environment through a single natural leak. For a photomask, the gases pass in and out through orifices with low-conductance filters disposed on the edges of the mask. For an atmospheric transport pod, the gases pass in and out through the natural leaks in the pod, i.e. the existing orifices equipped with filters, and through the door gaskets.

This natural leak by necessity has a low conductance, in order to ensure the protection of the inner atmosphere of the unsealed enclosed environment. It is therefore understood that pumping the sealed decontamination chamber too quickly may lower the gas pressure present around the unsealed enclosed environment within the sealed decontamination chamber too quickly, with the gases not having enough time to escape through the natural leak in the unsealed enclosed environment, so that inner atmosphere of the unsealed enclosed environment reaches a higher pressure, causing an outward differential pressure against the walls of the unsealed enclosed environment. By adjusting the pressure drop within the decontamination chamber, in accordance with the invention, it is ensured that the difference in pressure between the interior and exterior of the unsealed enclosed environment can be withstood by the walls of the unsealed enclosed environment.

Another benefit of this method is that it simultaneously removes pollution from both the inside and the outside of the unsealed enclosed environment.

The danger that excessive differential pressures may appear also exists during the steps of raising pressure within the unsealed enclosed environment. This is because, if gases are introduced into the sealed decontamination chamber, a gas pressure within the sealed decontamination chamber may rise rapidly, while the gases may more slowly penetrate through the low-conductance natural leak of the unsealed enclosed environment. In such a case, an inward-pushing differential pressure occurs in the unsealed enclosed environment, with this differential pressure potentially applying a mechanical stress that may degrade the walls of the unsealed enclosed environment.

Because of this, the inventive method preferably comprises a step of increasing pressure during which the increase in pressure within the decontamination chamber is adjusted so that the difference in pressure between the inside and the outside of the unsealed enclosed environment is at all times less than the difference in pressure that would cause mechanical warping that would damage the wall of the unsealed enclosed environment.

According to a first embodiment, during one method of the invention, it is possible to control the variations in pressure within the decontamination chamber by following a theoretical curve of pressure versus time. The theoretical curve of pressure versus time may be optimized beforehand on a test bench that comprises instrumented unsealed enclosed environments. For example, the test unsealed enclosed environment may comprise a pressure sensor on the inside, and warping sensors on its side walls. Experimental pressure drop curves are drawn by recording the warpings of the outside walls, and from among them, a theoretical pressure drop curve is chosen which prevents the slightest degradation to the outside walls of the unsealed enclosed environment.

According to a second embodiment, as an alternative or complement, it is advantageously possible to control the change in pressure within the decontamination chamber by following the signal given by at least one sensor detecting warping in the wall of the unsealed enclosed environment. The warping of the wall of the unsealed enclosed environment, measured by the warping sensor, is made to be less than the warping threshold that may cause the wall to permanently degree.

This embodiment has the additional significant advantage of preventing, with greater certainty, any chance that the wall of the unsealed enclosed environment may degrade, even in situations where the natural leak in the unsealed enclosed environment may accidentally and unforeseeably be partially or fully obstructed, such as if a filter were to be blocked.

It is understood that the ability to avoid such a danger of degradation is particularly useful for a semiconductor wafer transport pod, because the contents of the transport pod, to with a stack of semiconductor wafers, has a very high economic value in current nanotechnology applications: several tens of thousands of euros. Thus, the degradation of the wall of the transport pod may affect the later ability of the transport pod to ensure that the contents of the pod are effectively protected from outside pollution, as there is a danger that the entire contents of the transport pod may be rendered unusable.

In practice, according to the invention, in order to adjust the change in pressure within the decontamination chamber, the pumping ability of the pumping means may be varied by controlling their rotational velocity, and/or by controlling a variable conductance of the pumping means, and/or by controlling the means for introducing gas so as to vary a gas flow entering the decontamination chamber.

Preferably, the inventive method further comprises a purging step, said purging step comprising at least one operation of filling with purging gas, during which a purging gas is introduced into the decontamination chamber.

The purging gas may be synthetic air, preventing humidity from being introduced into the unsealed enclosed environment.

More advantageously, the purging gas may be nitrogen, which simultaneously prevents oxygen from being introduced into the unsealed enclosed environment.

Alternatively, it is possible to use another neutral gas, such as argon, which will be chosen based on the effects that this neutral gas may have on either the active surfaces of the products contained within the unsealed enclosed environment, or on the walls of the unsealed enclosed environment themselves.

In particular, the invention makes it clear that it is possible to confer upon the walls of the unsealed enclosed environment neutrality or passivity properties which are more stable over time, by way of a passivation effect which prevents significant and harmful degassing during the periods when a transport pod is actually in service, i.e. when it contains semiconductor wafers.

It has been observed, in accordance with the invention, that effective passivation of the walls of an atmospheric transport pod may be obtained by combining a sufficient pumping step, such as by lowering the pressure to about $10^{-2}$ to $10^{-3}$ Torr and maintaining this pressure during a sufficient period of time of about 20 minutes, and the purging step with a neutral gas. It is thought that this combination makes it possible to sufficiently expel the gas molecules previously trapped within the plastic walls of the atmospheric transport pod, and to then replace them with neutral gas molecules. Should the walls of the transport pod later be degassed, this degassing essentially produces only neutral gas, which has no polluting effect upon the active surfaces of the semiconductor wafers contained within the transport pod. It has also been observed that the wall of the transport pod passivated in this manner has a lower tendency to accumulate polluting gas molecules again.

As an alternative or complement, the purging step of the inventive method may further comprise at least one operation of pumping the purging gas, during which the mixture of the gas present in the decontamination chamber is extracted therefrom.

In such a situation, the operations of filling and pumping the purging gas may be performed simultaneously, with the pumping flow rate preferably being less than that of the injection flow rate.

As an alternative, multiple operations of filling and pumping the purging gas may be performed simultaneously.

To further increase the passivation effect, it is possible to provide for multiple purging steps comprising operations of filling and pumping the purging gas, which would alternate with the pumping steps.

At the end of the process, it is possible to advantageously provide for an operation of filling with purging gas, comprising a period of overpressure, during which the decontamination chamber is maintained at a pressure greater than atmospheric pressure, before being returned to atmospheric pressure.

Effective passivation of a transport pod by an inventive method thereby makes it possible to use the transport pod not only for transporting semiconductor wafers between operations of processing these wafers, but also for storing semiconductor wafers for longer periods of time, said wafers being kept within the transport pod, which itself constitutes the storage means.

In accordance with the invention, it is possible to apply the method to the processing of photomasks equipped with their film. In such a case, the gases are introduced and extracted through low-conductance filters separating the film from the active part of the mask, without removing the film.

Alternatively, it is possible to apply the invention to the processing of atmospheric transport pods, with the transport pod being kept closed. The transport pod may be empty, but it may advantageously contain semiconductor substrate wafers.

Preferentially, the pumping step is maintained for a period of time greater than that needed to ensure sufficient degassing of the walls of the unsealed enclosed environment.

The sufficient period of time may be determined by tests conducted beforehand on a series of unsealed enclosed environments.

As an alternative or complement, it is possible to provide for means for checking the decontamination status of the walls of the unsealed enclosed environment and for checking for products that may potentially be contained within the unsealed enclosed environment, with the decontamination operation being halted once a satisfactory decontamination state has been achieved.

According to a first possibility, the decontamination status is assessed by examining the pressure drop curve within the sealed chamber: if a predefined stable pressure level has been achieved, it may then be assumed that the decontamination is sufficient.

Alternatively, it is possible to analyze the pumped gases, and to research the presence of polluting gases; the pumping step is halted once the pollution level in the sealed chamber drops below a previously set value.

The decontamination step may be accelerated by heating the wall of the unsealed enclosed environment, such as to a temperature of about 60° C.

According to another aspect, the invention discloses a device for decontaminating an unsealed enclosed environment, comprising:

a decontamination chamber capable of containing the unsealed enclosed environment,
means for introducing gas capable of producing a gas injection flow within the decontamination chamber,
pumping means, capable of pumping the gas out of the decontamination chamber,
wherein:
the pumping means have a variable pumping capacity,
command means are provided to adjust the pumping capacity and to adjust the gas injection flow,
means for controlling the difference in pressure between the interior and exterior of the unsealed enclosed environment are provided,
the command means adjust the pumping capacity and/or the gas injection flow in such a way that the difference in pressure between the interior and exterior of the unsealed enclosed environment, determined by the means for controlling the difference in pressure, are at all times less than the difference in pressure that would cause mechanical warping that would damage the wall of the unsealed enclosed environment.

The means for introducing gas may advantageously comprise a source of purging gas.

The control means may affect the pumping velocity of the gas pumping means, and/or the variable conductance serially connected with the gas pumping means, and/or the means for introducing gas.

Preferably, the means for controlling the difference in pressure comprise, as an alternative or complement, at least one warping sensor, suitable for measuring the warping of the wall of the unsealed enclosed environment, and for providing a signal for controlling the changes in pressure within the decontamination chamber.

The decontamination device may advantageously comprise means for analyzing the pumped gases, in particular means for analyzing the nature and concentration of the gas species present. The gas analyzer may be constituted by a gas analyzer having means for ionizing the gases at atmospheric pressure or in a vacuum, and means for identifying the ionized gases by measuring an ion parameter. Such an analyzer is described, for example, in the document FR 2883412, incorporated here as a reference. It may comprise means for performing an operation on the measured parameters (for example a mean, a sum, or a combination).

The inventive device may also comprise a means for performing an operation on the lines of the various gases present, and/or a means for measuring humidity, for example a low-pressure humidity sensor such as a plasma source to generate a plasma within the gas mixture to be examined, associated with means for collecting the radiation emitted by the plasma and transmitting said radiation to an optical spectrometer, as described, for example, in the document EP 1568987, incorporated here as a reference.

The analysis of the composition of the gas mixture found within the enclosed environment may, in particular, make it possible to determine the origin of a contamination, and therefore the step of the method which was responsible for it (the location where the photomask or a semiconductor wafer was manufactured, transportation, storage area, etc.).

This analysis may also make it possible to monitor the quality of the enclosed environments, in order to establish real-time diagnostics and, if need be, to clean these enclosed environments.

Furthermore, the decontamination device may comprise heating means, which may by nature involve microwaves, infrared radiation, injecting a heated purging gas, or a combination of these means, in order to heat the unsealed enclosed environment.

In one possibility, the decontamination device is such that the pumping and purging stops are automated and are triggered by reading signals coming from the pumped gas analysis means and/or a warping sensor.

Advantageously, the decontamination chamber exhibits dimensions which are only slightly greater than those of the unsealed enclosed environment placed therein. The desired effects are to minimize the time needed to create a vacuum within the unsealed enclosed environment, and to make it possible to perform a gas analysis with as little dilution as possible. The inner volume of the decontamination chamber may ideally be about twice as large as the outer volume of the transport pod, and 20 times larger (for example, 2 liters) than the volume enclosed between the film and the active layer of the photomask. To achieve this, the decontamination chamber may be flexible or pliant.

The decontamination device may further comprise means for measuring the change in pressure within the decontamination chamber, such as a pressure sensor. Measuring a change in pressure particularly makes it possible to test whether the creation of a vacuum within the pod is proving to be abnormally difficult. This sort of behavior, which may be caused by the presence of a liquid, results in poor drying.

The gas pumping means comprise at least one primary pumping unit. Advantageously, the pumping means further comprise a secondary pumping unit, which may be a turbomolecular, molecular, or hybrid pumping unit, so as to significantly reduce the humidity content during the molecular phase by rapidly achieving low pressures of about $10^{-2}$ to $10^{-3}$ Torr.

SUMMARY DESCRIPTION OF THE DRAWINGS

Other characteristics and advantages of the invention will become apparent upon reading the following example embodiments, given only by way of non-limiting examples, and the attached drawings, in which:

FIG. 1 schematically depicts a decontamination device according to one embodiment of the invention, FIG. 2 depicts a cross-section of a device according to one embodiment of the invention used to decontaminate a transport pod, FIG. 3 depicts a cross-section of a device according to one embodiment of the invention used to decontaminate the film-covered photomasks;

DESCRIPTION OF PREFERRED EMBODIMENTS

Figure 1:
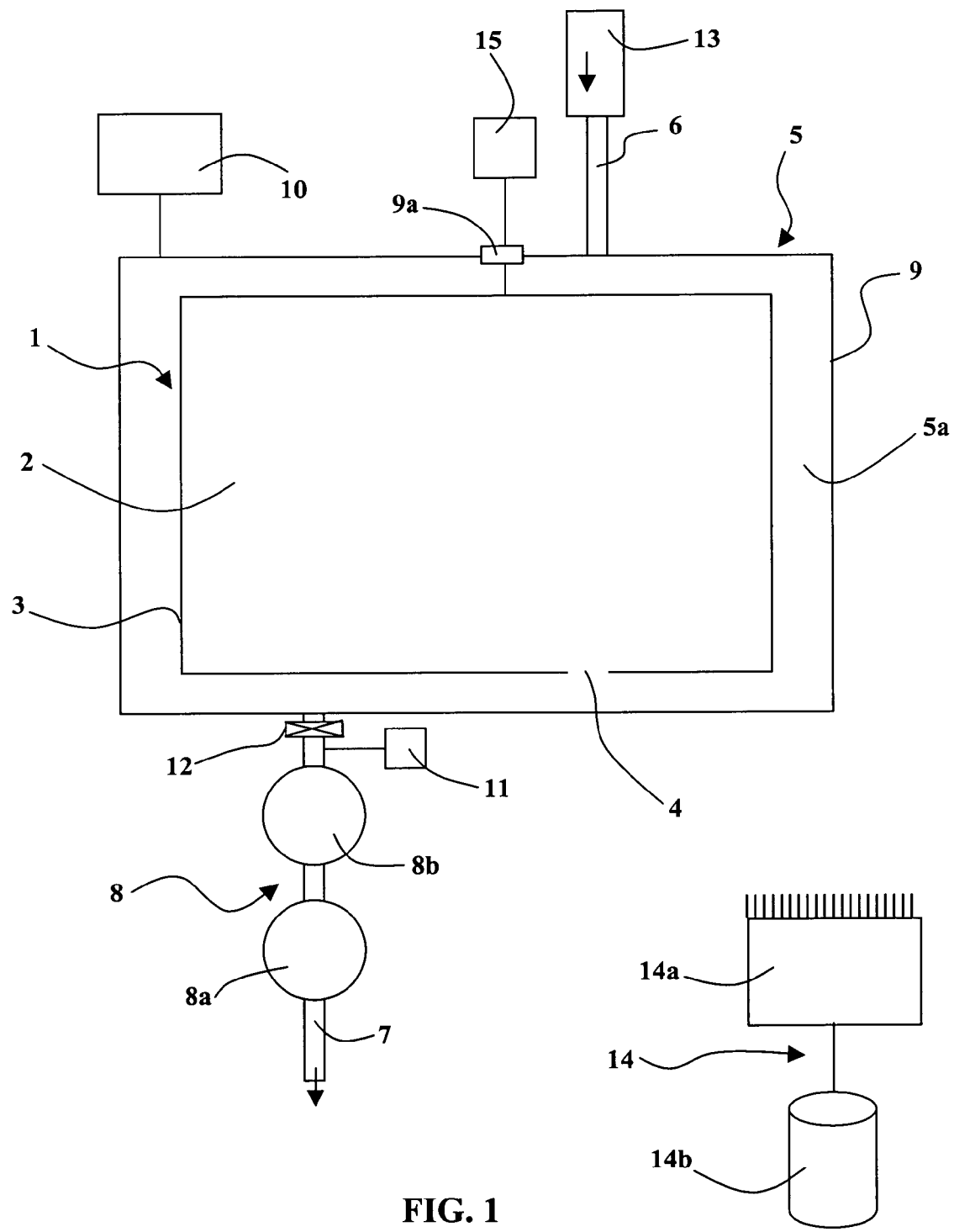

FIG. 1 shows an unsealed enclosed environment 1 in the form of a volume 2 delimited by a wall 3 and comprising one leak 4. During a first step of the method, the unsealed enclosed environment 1 is placed within a sealed decontamination chamber 5 whose inner volume 5$a$ is slightly greater than the volume of the unsealed enclosed environment 1, in order to contain it. The decontamination chamber 5, which may be flexible or pliant, comprises one door 5$b$ for inserting or removing the unsealed enclosed environment 1, an inlet 6 for a gas flow, and an outlet 7 connected to gas pumping means 8. The wall 9 of the decontamination chamber 5 is mechanically capable of withstanding a vacuum.

The pumping means 8 comprise at least one primary pumping unit 8$a$, and advantageously, a secondary pumping unit 8$b$, such as a turbomolecular, molecular, or hybrid pumping unit.

The inventive method comprises at least one step of simultaneously pumping the outside and inside of the unsealed enclosed environment 1, by using the leak 4 that exists within the wall 3 of the unsealed enclosed environment 1 so that the gases may escape the unsealed enclosed environment 1, making it so that the difference in pressure between the inner atmosphere and outer atmosphere of the unsealed enclosed environment 1 is at all times less than that which may cause mechanical warping that would damage the wall 3 of the unsealed enclosed environment 1.

The method further comprises at least one step of restoring the atmospheric pressure within the unsealed enclosed environment 1, by injecting a gas flow into the decontamination chamber 5 through the inlet 6, making use of the leak 4 so that the gases may enter the unsealed enclosed environment 1, and by making it so that the difference in pressure between the inner atmosphere and outer atmosphere of the unsealed enclosed environment 1 is at all times less than that which may cause mechanical warping that would damage the wall 3 of the unsealed enclosed environment 1.

To achieve this, the inventive decontamination device comprises means for controlling the atmospheric pressure within the decontamination chamber 5. Changes to this pressure are tracked and controlled, in order to preserve the mechanical properties of the wall 3.

In the embodiment depicted, the decontamination device comprises a pressure sensor 10, a variable conductance valve 12 connected to the pumping tube serially with the pumping means 8, a source of purging gas 13 connected to the inlet 6, command means 14, and potentially a warping sensor 15.

Figure 2:
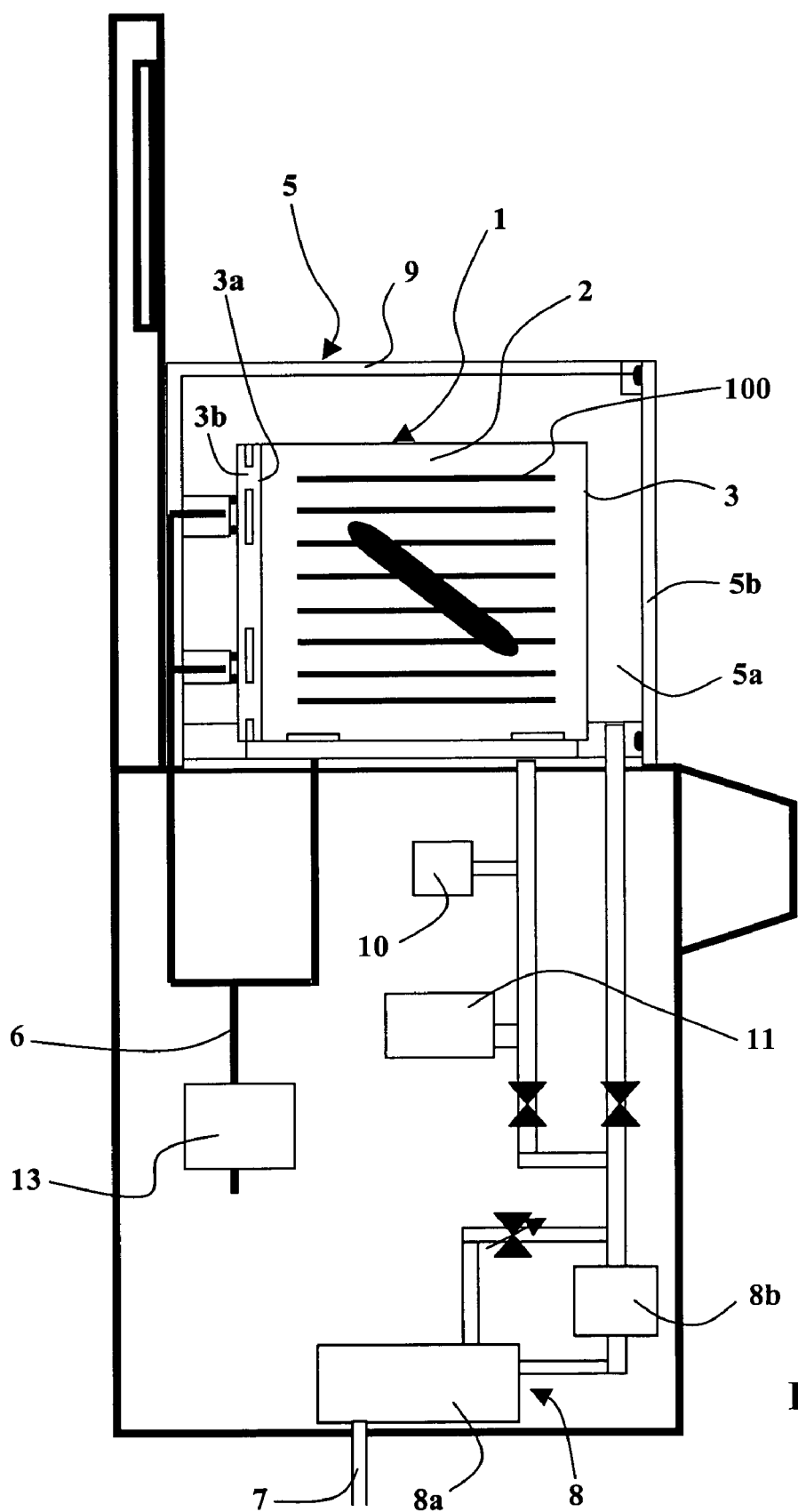

In the first embodiment of the invention depicted in FIG. 2, a cross-section is shown of a device for decontaminating an unsealed enclosed environment 1, which is an atmospheric transport pod and/or substrate wafer storage pod, having an inner volume 2 delimited by a side wall 3 equipped with an access hole 3a that may be blocked by a door 3b, and which makes it possible to add or remove a stack of substrate wafers 100. A decontamination chamber 5, which may be twice as voluminous as the unsealed enclosed environment 1 which is placed therein, is distinguished, and is connected to purging gas injection means 6, 13, gas pumping means 7, 8, pressure measurement means 10 for measuring the gas pressure within the decontamination chamber 5, and means for controlling the difference in pressure between the interior and exterior of the transport pod 1.

The inventive method is particularly well-suited to atmospheric transport pods 1, whose plastic structure cannot withstand differences in pressure which develop to rapidly or are too large, and which may damage the wall 3, such as by causing a fracture in the wall 3 of the transport pod 1. An atmospheric transport pod 1 contains leaks, and the inventive method proposes to make use of the pod's natural leaks 4 during the steps of the method, so that the transport pod 1 remains closed (the door 3b is closed) during the entire method.

We return to FIG. 1.

In the device depicted, the pumping means, comprising the primary pump 8a, the secondary pump 8a, and potentially a variable conductance valve 12, have a variable pumping capacity. The pumping capacity may be varied by controlling the closing of the variable conductance valve 12, and/or by controlling the change in the drive speed of the motors of the primary pump 8a and/or the secondary pump 8b.

The gas introduction means 6, 13 are capable of producing a variable gas injection flow within the decontamination chamber.

According to the invention, it is desired to control the change in pressure within the decontamination chamber 5, in such a way that the difference in pressure between the interior and exterior of the unsealed enclosed environment 1 is at all times less than the difference in pressure that would cause mechanical warping that would damage the wall 3 of the unsealed enclosed environment 1.

To achieve this, means for controlling the difference in pressure between the interior and exterior of the unsealed enclosed environment 1 are provided, and command means 14 are provided to adjust the pumping capacity and adjust the gas injection flow based on the information received from the means for controlling the difference in pressure.

The command means 14 may comprise a processor 14a, associated with a memory 14b within which command programs are stored. The processor 14a may receive information from various sensors, such as the pressure sensor 10, the warping sensor 15, and a pumped gas analyzer 11.

At its output, the processor 14a is connected, in a manner known per se, to various actuators used to operate the variable conductance valve 12, the driving motors of the primary pump 8a and secondary pump 8b, and a valve for controlling the flow rate of the gas introduction means 6, 13.

Figure 4:
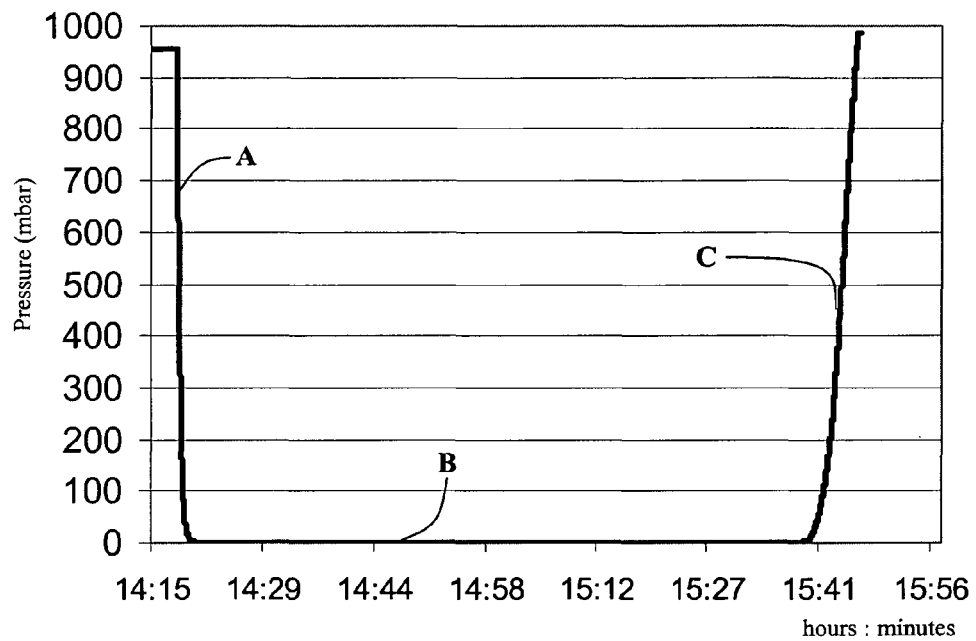
FIG. 4 depicts one possible shape of the theoretical curve of pressure versus time, used to control the change in pressure within the decontamination chamber.
Figure 5:
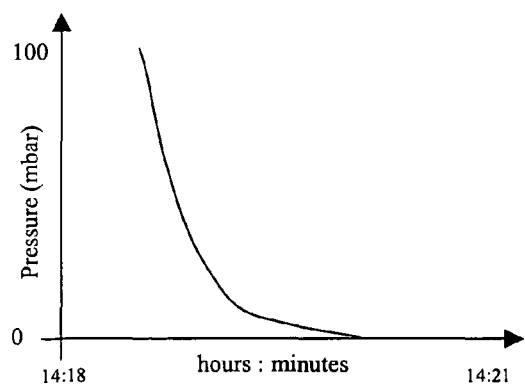
FIGS. 5 and 6 are detailed views of the pressure change curve of FIG. 4, in the areas close to the low equilibrium pressure.
Figure 6:
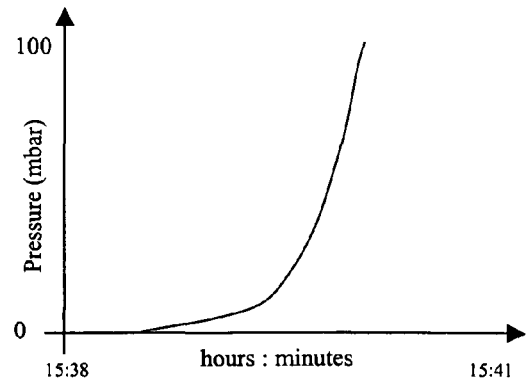

In a first embodiment, the command means 14 control the variation in pressure within the decontamination chamber 5 by following a theoretical curve of pressure versus time. This theoretical curve is saved in the memory 14b, during a prior acquisition step. FIGS. 4, 5, and 6 depict one possible shape of the theoretical curve of pressure versus time. They show a first step A of pumping, a second step B of maintaining the equilibrium low pressure limit, and a third step C of raising the pressure by injecting gas into the decontamination chamber 5.

The processor 14a receives information from the pressure sensor 10, and, based on a program saved in the memory 14b, adjusts the pumping capacity of the pumping means 8 and the flow of the gas injection means 6, 13 so that this measured pressure permanently follows the theoretical curve of pressure versus time saved in the memory 14b.

During an acquisition step, the theoretical pressure curve is determined, by ensuring that, in a standard unsealed enclosed environment 1, the difference in pressure between the interior and exterior of the unsealed enclosed environment 1 remains permanently less than difference in pressure that would cause mechanical warping that would damage the wall 3 of the unsealed enclosed environment 1. Next, it is assumed that the same theoretical curve of pressure versus time may be applied to all unsealed enclosed environments 1 of the same type.

According to a preferred embodiment, the variation in pressure within the decontamination chamber 5 is controlled by tracking a signal given by a warping sensor 15 capable of detecting the actual warping of the wall 3 of the unsealed enclosed environment 1 during the pumping steps and/or the steps of raising pressure within the decontamination chamber 5. In such a case, the processor 14a receives the signals sent by the warping sensor 15, and, based on a program saved in the memory 14b, operates the actuators of the gas introduction means 6, 13 and pumping means 8 so as to vary the pressure within the decontamination chamber 5 sufficiently slowly so that the flow rate of the leak 4 enables the inner atmosphere 2 of the unsealed enclosed environment 1 to closely follow the variation in pressure within the decontamination chamber 5.

Figure 11:
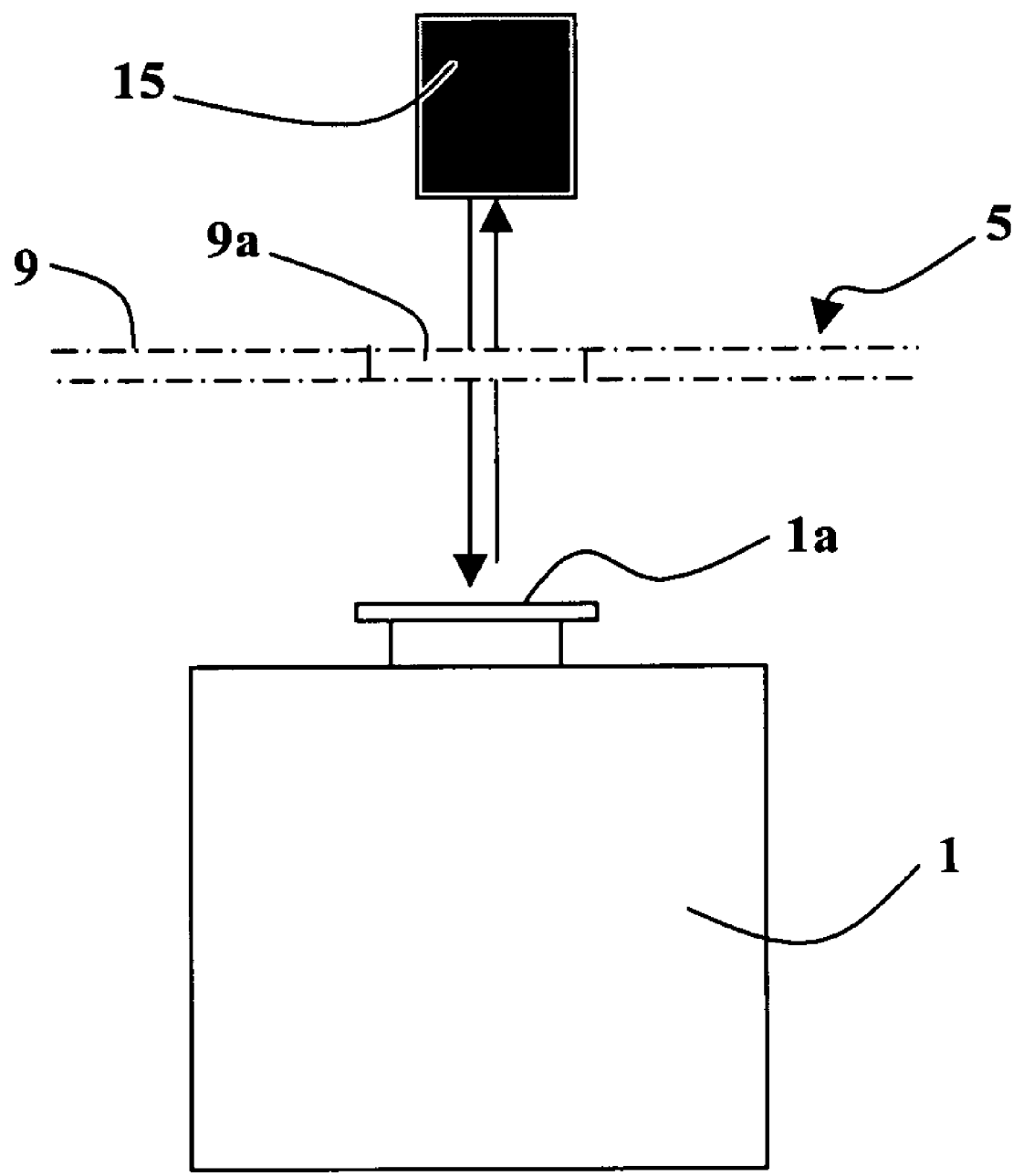
FIG. 11 depicts one embodiment of the decontamination device, and in particular the adaptation of a warping sensor.

For the warping sensor 15, a sensor depicted in FIG. 11, in conjunction with an unsealed enclosed environment 1 which is by nature a FOUP transport pod, may advantageously be used. Such a FOUP transport pod comprises, on its upper surface, a mushroom-shaped grasping structure 1a, known as a MUSHROOM, which is generally opaque while the rest of the transport pod is made of a transparent plastic material. The wall 9 of the decontamination chamber 5 comprises a transparent porthole 9a, aligned with the grasping structure 1a. The warping sensor 15 comprises a laser sender-receiver, which detects, through the porthole 9a, the distance that separates it from the grasping structure 1a. One may select such a laser sender-receiver capable of measuring distances between 30 mm and 130 mm with an accuracy of about 0.5 mm.

Such a sensor may serve to detect a presence (if the distance is greater than 130 mm, this means that there is no unsealed enclosed environment 1 inside the decontamination chamber 5), to check for proper positioning (if the distance is not within the given range, this means that the unsealed enclosed environment 1 is improperly positioned), and to measure warping, ensuring the integrity of the unsealed enclosed environment 1 during the method (if the warping exceeds a threshold, the pumping or injection must be slowed down or stopped).

The benefit of using the warping sensor 15 is to know, with certainty, the warping of the wall 3 of the unsealed enclosed environment 1, no matter what the status of the leak 4 may be, i.e. the same whether it is fully or partially blocked.

Now let us consider FIGS. 5 and 6, which depict an intentional slowing of the pressure variations speed once it is close to the limiting low pressure. The effect of this intentional slowing is to reduce the particle pollution on the active surfaces of the masks or semiconductor wafers. It is thought that this particle pollution appears when variations in pressure occur too quickly at low pressure, and that it results from the increase in the mean free path of the particles when the pressure is very low.

The decontamination device may comprise heated walls in order to prevent the gases must be expelled from being adsorbed. The wall 9 of the decontamination chamber 5 may advantageously be made of polished-mirror stainless steel, enabling a very good surface condition, or made of quartz. These materials make it possible to limit the degassing of the wall 9. The shape of the decontamination chamber 5 may be cylindrical in order to reduce dead volume. The decontamination chamber 5 may also comprise a porthole made of glass, quartz, or any other transparent material compatible with the vacuum, the variations in pressure, and/or the plasma, so that the operator can check that the stack of substrates 100 inside the transport pod 1 has not tipped over.

According to one variant not pictured, the inventive method proposes to simultaneously pump in and out of the transport pod. This differential pumping makes it possible to create a vacuum more quickly and makes it easier to interpret the data. To achieve this, the pumping means of the device comprise first pumping means for creating a vacuum in the sealed compartment and second pumping means connected to at least one orifice, blocked by a filter, of the sealed side wall of the transport pod for pumping the inside of the transport pod. These second pumping means comprise a second pumping tube.

Now let us consider FIGS. 7 to 10, which depict the decontamination and passivation mechanism of the wall 3 of the unsealed enclosed environment 1, which here is a transport pod.

The figures depict a portion of the wall.

Figure 7:
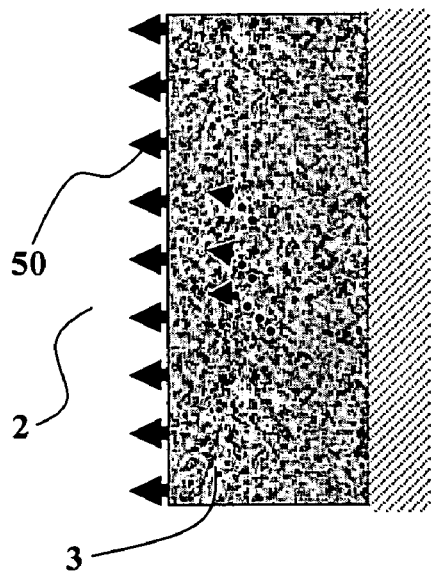
FIGS. 7 to 10 depict gas exchanges during various stages of removing pollution from a FOUP transport pod.

In FIG. 7, during the step of lowering the working pressure (curve A in FIG. 4), the gas molecules trapped inside the wall 3 escape into the inner space 2 of the unsealed enclosed environment 1, as shown by the arrows 50.

Figure 8:
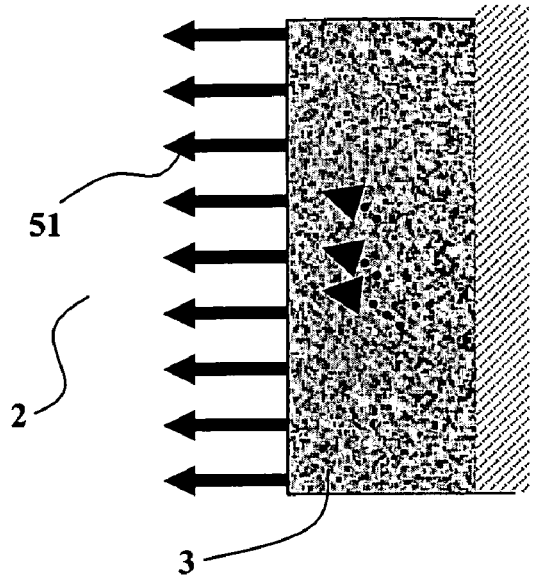

In FIG. 8, during the decontamination step at a lower balance pressure (step B in FIG. 4), the degassing flow (arrow 51) occurs, then gradually reduces as the pores of the wall 3 are emptied. After a period of about 20 minutes of step B, the degassing flow becomes low.

Figure 9:
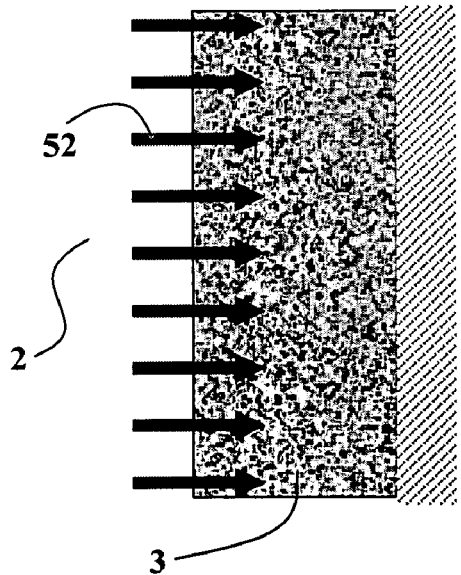

In FIG. 9, corresponding to step C in FIG. 4, during which a purging gas is introduced, the purging gas molecules gradually penetrate into the wall 3, as illustrated by the arrows 52.

Figure 10:
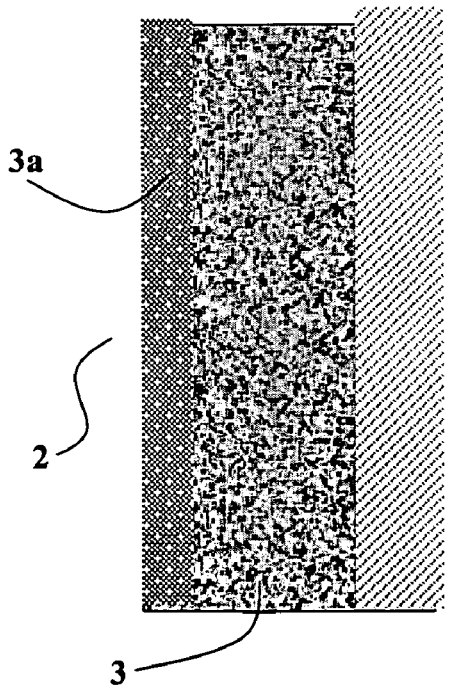

In FIG. 10, at the end of the step of raising the pressure to atmospheric pressure, the purging gas molecules have replaced the initial gas and within the wall 3 form a boundary layer 3a containing the purging gas.

The makeup of this boundary layer 3a ensures the passivation of the wall 3, by correctly choosing the purging gas.

The resulting effect of the decontamination and passivation method in accordance with the invention has been measured using the SEMI E 108-0301 test method defined and published by the organization Semiconductor Equipment and Materials International (SEMI). This method analyzes the contamination that appears in the silicon wafers placed inside the unsealed enclosed environment 1.

It has been observed that the inventive method considerably reduces the effect of degassing the walls of a FOUP transport pod.

Figure 12:
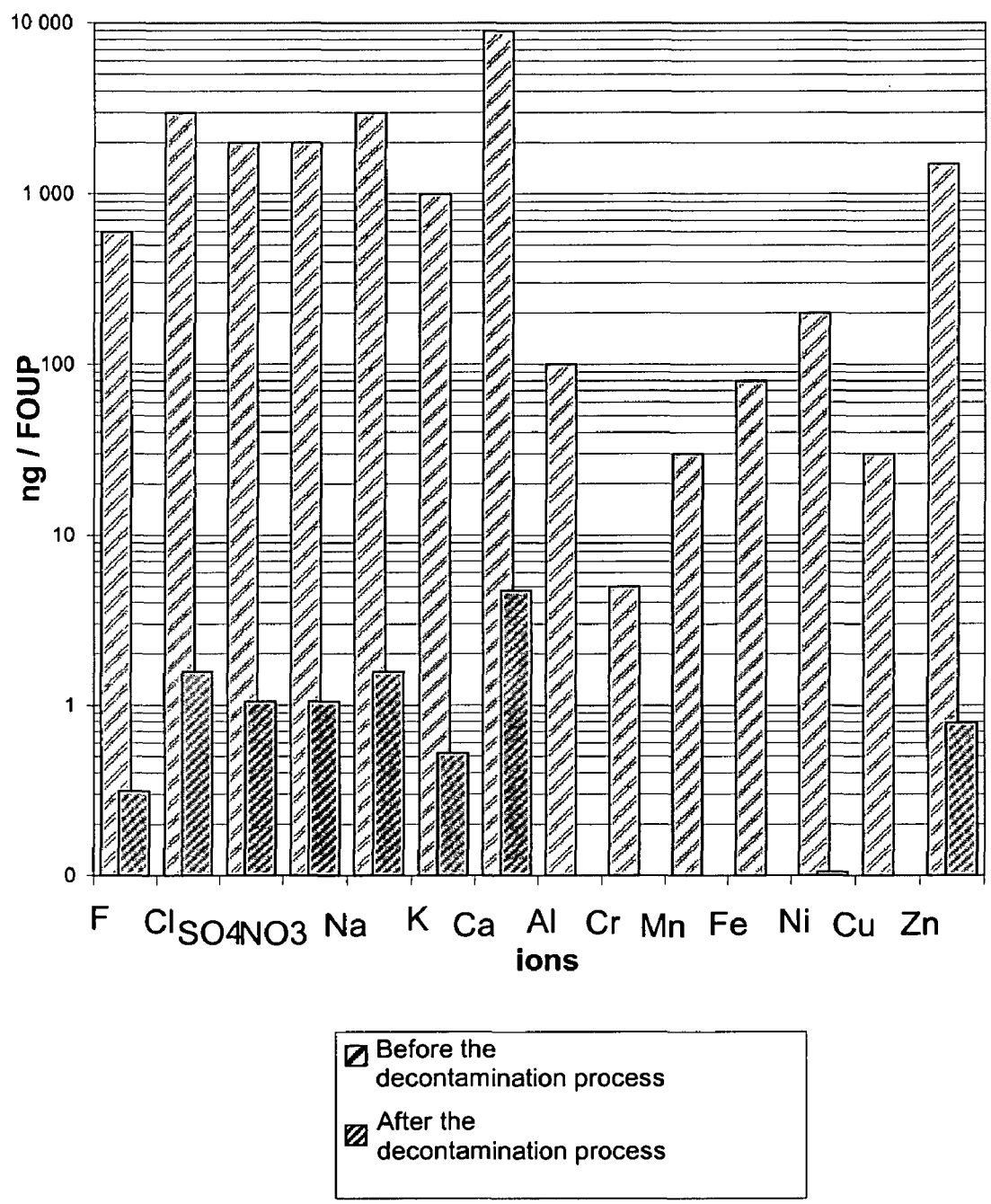
FIG. 12 depicts the results of the decontamination measurement.

This reduction is depicted in FIG. 12, for various ions.

Figure 13:
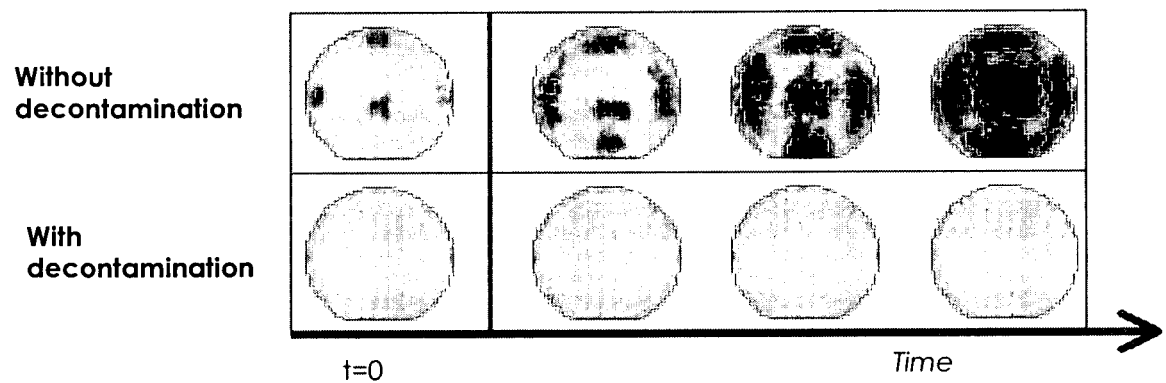
FIG. 13 depicts the effect of the decontamination, by observing the development of crystals on the active surface of a product within the unsealed enclosed environment.

In practice, when semiconductor wafers are placed inside a transport pod, a gradual growth of crystals on the active surface may generally be observed, as depicted in the upper part of FIG. 13. On the other hand, when the semiconductor wafers are placed inside a transport pod that has undergone a step of decontamination and passivation in accordance with the inventive method, the growth of the crystals is heavily retarded, and becomes undetectable over the period of use, as depicted in the lower part of FIG. 13.

Figure 14:
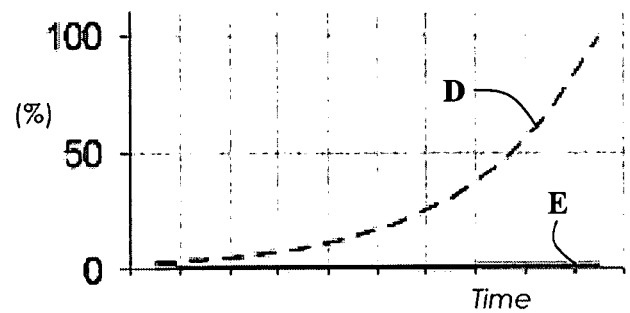
FIG. 14 depicts, in the form of a graph over time, the effect of decontamination and passivation on the development of the crystals on the active surface of the products.

FIG. 14 detects the same phenomenon: Curve D depicts a gradual increase in crystals, inside a transport pod which did not undergo the step of decontamination and passivation, while curve E detects the nearly undetectable development of crystals when the semiconductor wafers are placed inside a transport pod that did undergo the step of decontamination and passivation.

Very advantageously, the device of FIG. 1 may be used for storing semiconductor wafers inside transport pods. Multiple decontamination chambers 5 may be connected in parallel to a single pumping system 8 and to a single gas injection means 6, 13, which ensures the decontamination of the inner atmosphere of the substrates 100 contained within the transport pods 5 without damaging the walls 3.

The inventive device has the advantage of enabling an increase in the shelf life of the substrate transport pods. Once they have gone through the decontamination chamber 5, the transport pods may be stored long-term without any chance of contaminating the substrates which they contain. The method implemented in the device particularly prevents contamination from the outside atmosphere, such as oxygen which may oxidize the surface of the substrates, particularly the semiconductor wafers, and more particularly those coated with germanium or copper deposits.

Figure 3:
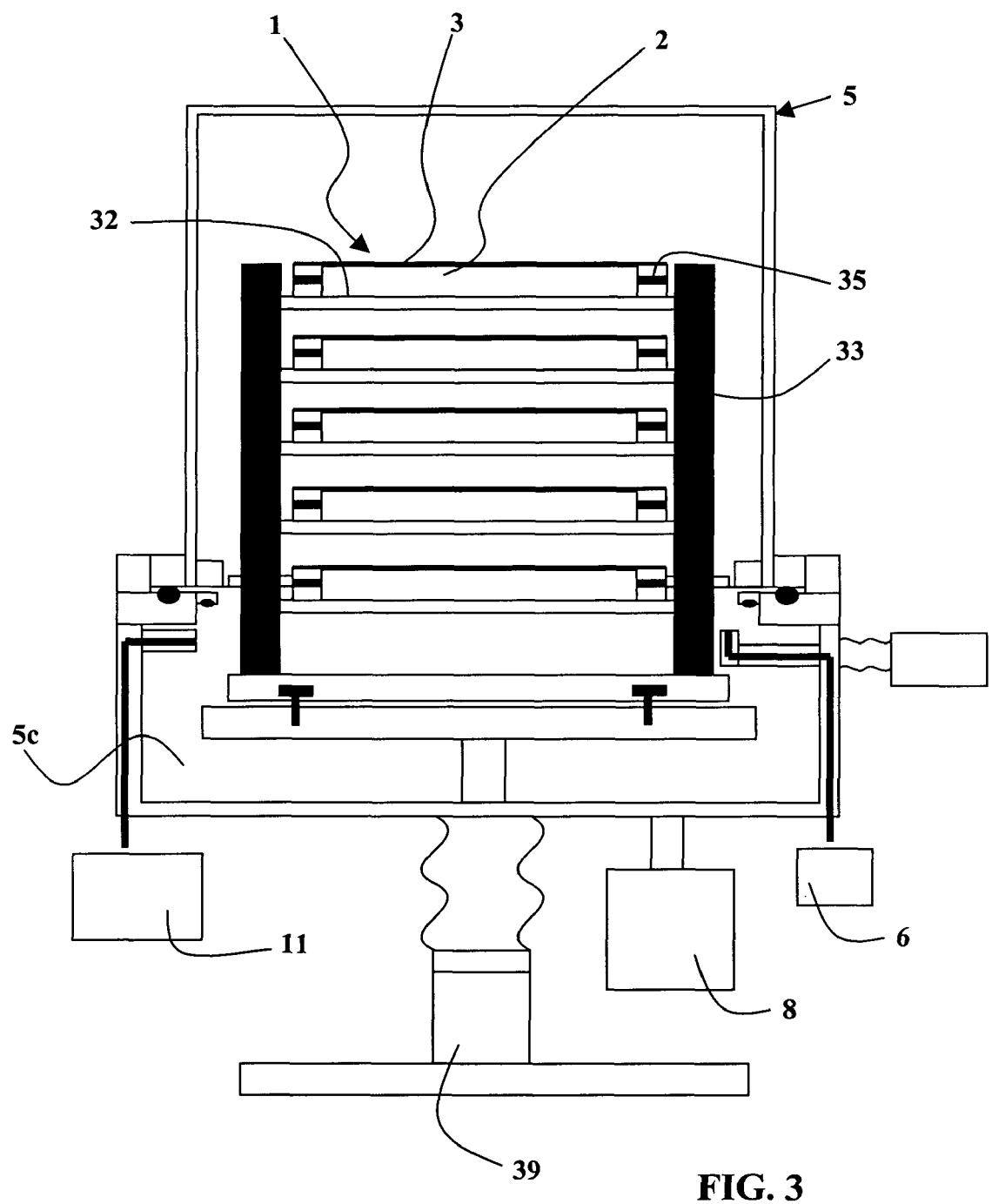

Now we shall consider FIG. 3, which detects a second embodiment in accordance with the invention. The inventive method is here applied to a situation wherein the unsealed enclosed environment 1 is a photomask equipped with its film. The enclosed environment comprises the volume 2 between its wall 3, constituted by the film, and the active surface 32 of the photomask that it covers. Openings 35 with low-conductance filters are located on the edge of the unsealed enclosed environment 1.

A decontamination chamber 5 may contain one or more photomasks 1. The decontamination chamber 5 may itself be a transport pod, or may be the transport pod attached to a small additional volume 5c which makes it possible to open the transport pod, or the decontamination chamber may be a separate pod. If there are multiple photomasks 1, they are stacked inside a carrier 33 which is placed inside a sealed, low-volume decontamination chamber 5. It is preferable that the decontamination chamber 5 has a low volume (for example, 20 times larger than the volume 2 underneath the wall 3), to ensure a better decontamination effect. The decontamination chamber 5 closely envelops the carrier 22, upon which the photomask(s) 1 rest, so that when it is in the closed position, the decontamination chamber 5 is not much more voluminous than the carrier 33.

The device comprises an inlet 6 for injecting the purging gas, and an outlet connected to pumping means 8. The pumping means 8 may advantageously be adapted to pump slowly, which prevents an excessive difference in pressure from forming on either side of the film's wall 3. This wall is extremely fragile, and it is essential to not exceed its warping limit (the maximum difference in interior/exterior pressure is about 1 Pa).

Figure 15:
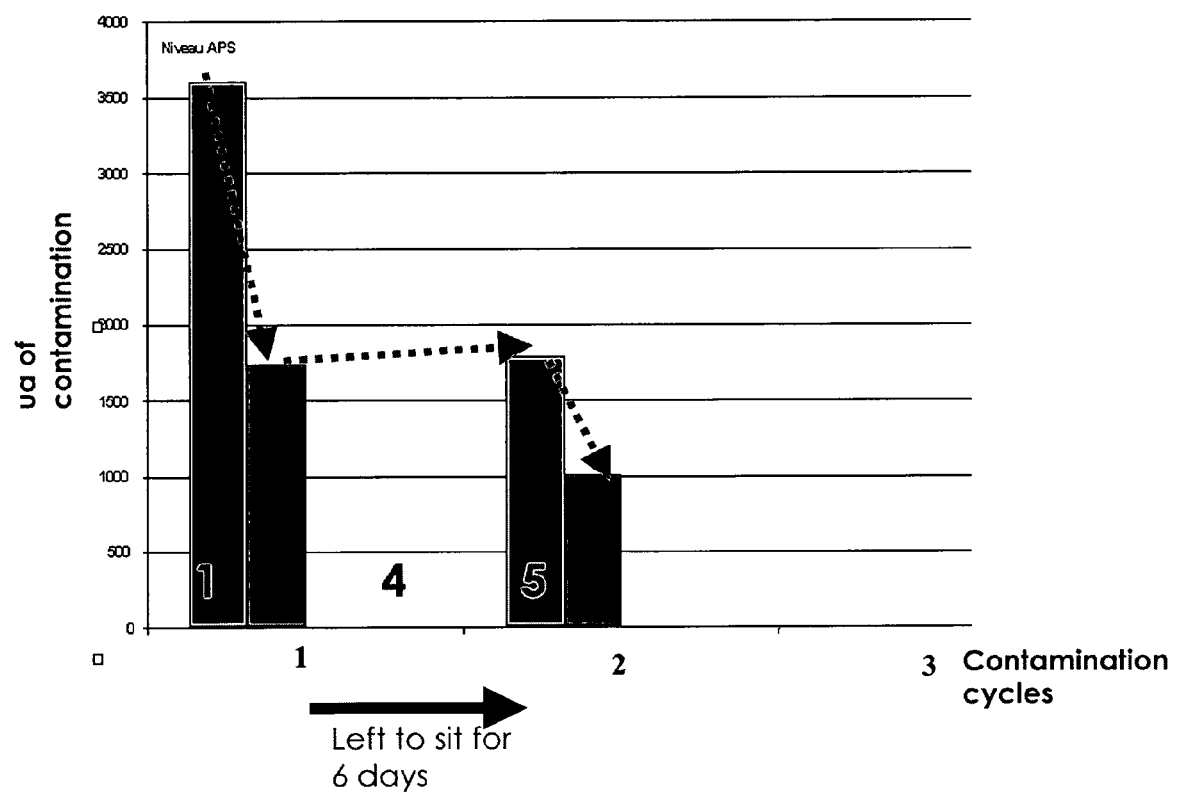
FIG. 15 depicts the steps of the passivation measurement method, by observing the contamination.

FIG. 15 depicts the effect obtained by decontaminating masks in accordance with the inventive method. During a step one, the initial degassing of a mask transport pod is measured, prior to decontamination.

From step 1 to step 3, a 20 minute decontamination cycle is carried out, with nitrogen or dry air.

At the end of decontamination, the final degassing of the mask transport pod is measured. It is observed that the final degassing level is much lower than the initial degassing level.

During step 4, the mask transport pod is left to sit in ambient air for six days.

During step 5, the degassing of the mask transport pod is once again measured. It is observed that this degassing, after being left to sit for six days, has practically the same level as the final degassing before being left to sit for six days. In the absence of the decontamination method, the degassing level would have been the same as the initial degassing in step 1.

A second 20-minute decontamination cycle may be carried out with nitrogen or dry air, during a step 6, and the degassing is measured again. When this occurs, the effect of the second decontamination, which further reduces the degassing, is observed.

The essential observation of this FIG. 15 is at the mask transport pod maintained its reduced degassing property after the six-day period was complete.

Sampling means associated with a gas analyzer 11 are connected to the decontamination chamber 5. The pumping means 8 are separate from the sampling means, and thereby enable pumping at a much higher flow rate, of about 10 sim. Actuator means 39, such as cylinders, make it possible to raise or lower the carrier 33 inside the decontamination chamber 5.

The gas analyzer 11 may be an ion mobility spectrometer (or IMS), such as one described in the document FR 2,883, 412, incorporated here as a reference, which has the advantage of measuring residual gas quantities of a few ppb in real time. Sampling means, such a small pump with a flow rate of about 0.2 L/min, make it possible to sample the atmosphere within the environment. Towards the end of the pumping step, a sample of the gas contained within the decontamination chamber 5 is sent to the gas analyzer 11 in order to determine whether the set level of decontamination has been reached, and if the pumping may be halted. The low volume of the decontamination chamber 5 makes it possible to improve the detection sensitivity of the measurement, by limiting the dilution of the gas mixture contained within the inner volume of the unsealed enclosed environment 1.

Once the desired decontamination level has been achieved, pumping is halted, and the unsealed enclosed environment 1 is returned to its initial pressure by introducing clean gas.

During the purging step, the purging gas used may be of a density greater than that of the gas found inside the enclosed atmosphere, i.e. its density is greater and/or colder because the conductance of the filter is proportional to the square root of the quotient of the temperature divided by the mass of the gas. The mass properties and/or the temperature of the purging gas will enable it to nearly avoid passing through the low-conductance filters 35 found on the edge of the photomask where the film wall 3 is affixed. In this manner, the purging gas will gradually primarily replace the gas atmosphere inside the decontamination chamber 5, and will leave the atmosphere inside the unsealed enclosed environment 1 intact so that it may be analyzed. This is because the gas quantities to be detected are very low, and this does not dilute them. Additionally, this purging gas may preferentially be a gas which is not already present by a majority inside the decontamination chamber 5, which will make it possible to distinguish it from the mixture coming from the atmosphere of the enclosed environment, and to reduce the problem of dilution. In such an application, argon is particularly suitable as a purging gas, because it has a high density, is inert, and is commonly available near processing equipment.

Alternatively, the purging gas may be constituted by a synthetic air which is 80% nitrogen and 20% oxygen. The synthetic air may advantageously be used in combination with IMS gas analyzers, which are calibrated to this mixture.

More commonly, nitrogen may advantageously be used.

As indicated above, the invention has applications in decontaminating and passivating photomasks or transport pods for semiconductor wafers. It may also particularly be applied to molecular inspection and decontamination in the field of medicine (prostheses, etc.), the field of agrifood, or the field of automobiles (oxidation of precision parts, for example).

The invention is not limited to the embodiments that have been explicitly described; rather, it includes the variations and generalizations within the skill of a person having ordinary skill in the art.

The invention claimed is:

1. A method for decontaminating an unsealed enclosed environment (1) comprising an inner space (2) delimited by a wall (3) having a natural leak (4), comprising the following steps:
    the unsealed enclosed environment (1), having its natural leak (4), is placed within a sealed decontamination chamber (5) comprising means for introducing gas (6) and means for pumping out gas (7, 8),
    the gas contained within the decontamination chamber (5) is pumped out by adjusting the pressure drop within the decontamination chamber (5) in such a way so that the difference in pressure between the interior and exterior of the unsealed enclosed environment (1) is at all times less than the difference in pressure that would cause mechanical warping that would damage the wall (3) of the unsealed enclosed environment (1).

2. A method according to claim 1, wherein a step of raising pressure is comprised, during which the increase in pressure within the decontamination chamber (5) is adjusted so that the difference in pressure between the interior and exterior of the unsealed enclosed environment (1) is at all times less than the difference in pressure that would cause mechanical warping that would damage the wall (3) of the unsealed enclosed environment (1).

3. A method according to claim 1, wherein the variation in pressure within the decontamination chamber (5) is controlled by following a theoretical curve of pressure versus time.

4. A method according to claim 1, wherein the variation in pressure within the decontamination chamber (5) is controlled by following a signal given by at least one sensor detecting warping in the wall (3) of the unsealed enclosed environment (1).

5. A method according to claim 1, wherein to adjust the change in pressure within the decontamination chamber (5), the pumping capacity of the pumping means (7, 8) is varied, by controlling their rotational velocity, and/or by controlling a variable conductance (12) of the pumping means, and/or a gas flow entering the decontamination chamber (5) is varied by controlling the means for introducing gas (6).

6. A method according to claim 1, further comprising a step of purging, said step of purging comprising at least one operation of filling with purging gas, during which a purging gas is introduced into the decontamination chamber (5).

7. A method according to claim 6, wherein the sub of purging further comprises at least one purging gas pumping operation during which the mixture of the gas present in the decontamination chamber (5) is extracted therefrom.

8. A method according to claim 7, wherein the purging gas filling and pumping operations are performed simultaneously, with a pumping flow rate less than the injection flow rate.

9. A method according to claim 7, wherein multiple purging gas filling and pumping operations are performed in succession.

10. A method according to claim 6, wherein multiple purging steps, comprising purging gas filling and pumping operations, alternate with pumping steps.

11. A method according to claim 6, wherein the purging gas filling operation comprises an overpressure period, during which the decontamination chamber (5) is kept at a pressure greater than atmospheric pressure, before being returned to atmospheric pressure.

12. A method according to claim 6, wherein the purging gas is nitrogen.

13. A method according to claim 6, wherein the purging gas is synthetic air.

14. A method according to claim 6, wherein the purging gas is introduced into the unsealed enclosed environment (1), and extracted therefrom, through the filters (35) that said environment comprises.

15. A method according to claim 1, wherein the unsealed enclosed environment (1) being a photomask equipped with its film (3), the purging gas is introduced and extracted through the low-conductance filters separating the film from the active part of the mask.

16. A method according to claim 1, wherein the unsealed enclosed environment (1) is a closed atmospheric transport pod.

17. A method according to claim 16, wherein the transport pod contains semiconductor substrate wafers (100).

18. A method according to claim 1, wherein low pressures, of about $10^{-2}$ to $10^{-3}$ Torr, are achieved within the decontamination chamber (5).

19. A method according to claim 1, wherein the gases pumped are analyzed, and the pumping step is halted once the level of pollution inside the sealed decontamination chamber (5) becomes less than a preset value.

20. A device for decontaminating an unsealed enclosed environment (1), comprising:
a decontamination chamber (5) capable of containing the unsealed enclosed environment (1),
means for introducing gas (6, 13), capable of producing a gas injection flow within the decontamination chamber (5),
pumping means (7, 8), capable of pumping the gases out of the decontamination chamber (5),
wherein:
the pumping means (7, 8) have a variable pumping capacity,
command means (14) are provided to adjust the pumping capacity and adjust the gas injection flow,
means for controlling the difference in pressure between the interior and exterior of the unsealed enclosed environment (1) are provided,
the command means (14) adjust the pumping capacity and/or the gas injection flow so that the difference in pressure between the interior and exterior of the unsealed enclosed environment (1), determined by the means for controlling the difference in pressure, is at all times less than the difference in pressure that would cause mechanical warping that would damage the wall (3) of the unsealed enclosed environment (1).

21. A device according to claim 20, wherein the means for controlling the difference in pressure comprise a theoretical curve of pressure versus time, saved in the memory (14b) of the command means (14), and which the command means (14) follow in order to vary the pumping capacity and/or gas injection flow over time.

22. A device according to claim 20, wherein the means for controlling the difference in pressure comprise at least one warping sensor (15), adapted to measure the warping of the wall (3) of the unsealed enclosed environment (1), and providing a signal for controlling the variation in pressure within the decontamination chamber (5).

23. A device according to claim 20, further comprising means for heating the unsealed enclosed environment (1).

24. A device according to claim 20, wherein the means for introducing gas (6, 13) comprise a source of purging gas, this gas being nitrogen or synthetic air.

25. A device according to claim 20, further comprising pumped gas analysis means (11).

26. A device according to claim 25, wherein the analysis means (11) comprise means for ionizing the pumped gases, means for identifying the ionized gases by measuring an ion parameter, and means for performing an operation on the measured parameters.

27. A device according to claim 25, wherein the pumping and purging steps are automated and are triggered by reading signals from the pumped gas analysis means (11) and/or a warping sensor (15).

28. A device according to claim 20, wherein the decontamination chamber (5) is of dimensions slightly greater than those of the unsealed enclosed environment (1).

29. A device according to claim 20, further comprising measuring means (10) for measuring the change in pressure within the decontamination chamber (5).

30. A device according to claim 20, wherein the pumping means (7, 8) comprise a primary pump (8a) and a secondary pump (8b), and capable of establishing a vacuum of
about $10^{-2}$ to $10^{-3}$ Torr within the decontamination chamber (5).

* * * * *